United States Patent [19]

Tsuo et al.

[11] Patent Number: 4,960,675

[45] Date of Patent: Oct. 2, 1990

[54] HYDROGEN ION MICROLITHOGRAPHY

[75] Inventors: Y. Simon Tsuo, Lakewood; Satyen K. Deb, Boulder, both of Colo.

[73] Assignee: Midwest Research Institute, Kansas City, Mo.

[21] Appl. No.: 229,298

[22] Filed: Aug. 8, 1988

[51] Int. Cl.⁵ .............................................. G03C 5/00
[52] U.S. Cl. .................................. 430/311; 430/325; 430/326; 430/327; 250/472.3; 156/628
[58] Field of Search ............... 430/311, 327, 319, 325, 430/326; 156/628; 250/492.3

[56] References Cited

U.S. PATENT DOCUMENTS

| | | | |
|---|---|---|---|
| 4,377,437 | 3/1983 | Taylor et al. | 156/628 |
| 4,395,467 | 7/1983 | Vossen et al. | 428/697 |
| 4,569,124 | 2/1986 | Rensch et al. | 437/41 |
| 4,601,778 | 7/1986 | Robb | 156/628 |
| 4,615,904 | 10/1986 | Ehrlich et al. | 427/38 |

OTHER PUBLICATIONS

Cambria et al., "Mask and Circuit Repair with Focused-Ion Beams", Solid State Techn., 1987, pp. 133-136.
Grenier, "Wafer Fabrication Equipment Five Year Forecast", Solid State Techn., 1988, pp. 67-70.
Marche et al., "Amorphous Silicon as an Inorganic Resis", SPIE vol. 471, Electronbeam, X-Ray and Ion Beam Techniques for Submicron Lithographies III, 1984, pp. 60-65.
O'Connell, "Formation of Resistive Films by Ion Bombardment", IEE Colloquim of Ion Implantation, 1970, p. 7 Peters, Semiconductor International, 1988, pp. 96-100.
Thurber, Semiconductor International, 1988, p. 15.
Tsuo et al., "Ion Beam Hydrogenation of Amorphous Silicon", Appl. Phys. Lett. 51(18), 1987, pp. 1436-1438.

Primary Examiner—Jose Dees
Attorney, Agent, or Firm—Ken Richardson

[57] ABSTRACT

Disclosed is a hydrogen ion microlithography process for use in microelectronic fabrication and semiconductor device processing. The process comprises the steps of providing a single layer of either an amorphous silicon or hydrogenated amorphous silicon material. A pattern is recorded in a selected layer of amorphous silicon or hydrogenated amorphous silicon materials by preferentially implanting hydrogen ions therein so as to permit the selected layer to serve as a mask-resist wafer suitable for subsequent development and device fabrication. The layer is developed to provide a surface pattern therein adaptable for subsequent use in microelectronic fabrication and semiconductor device processing.

24 Claims, 3 Drawing Sheets

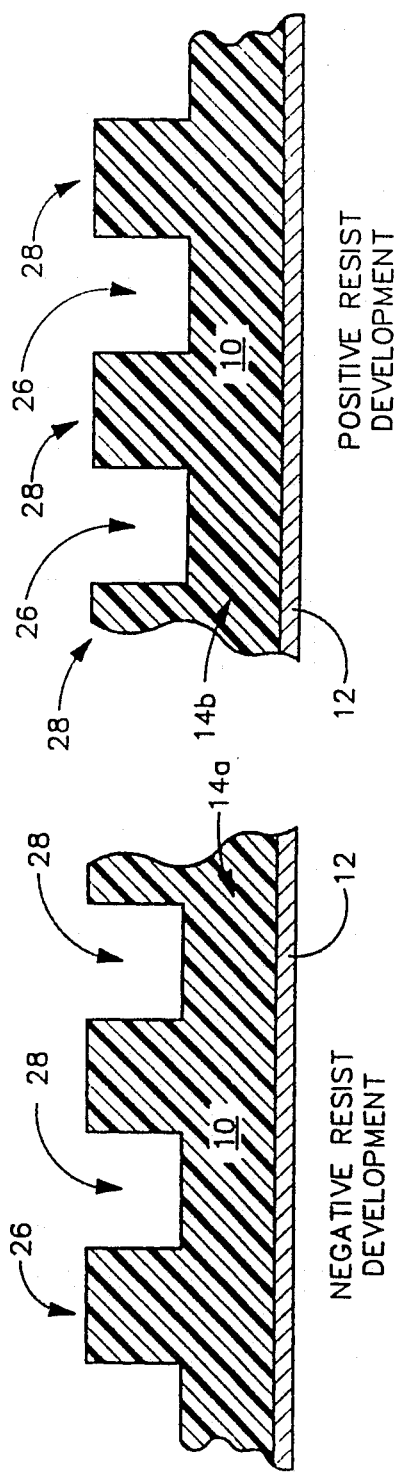
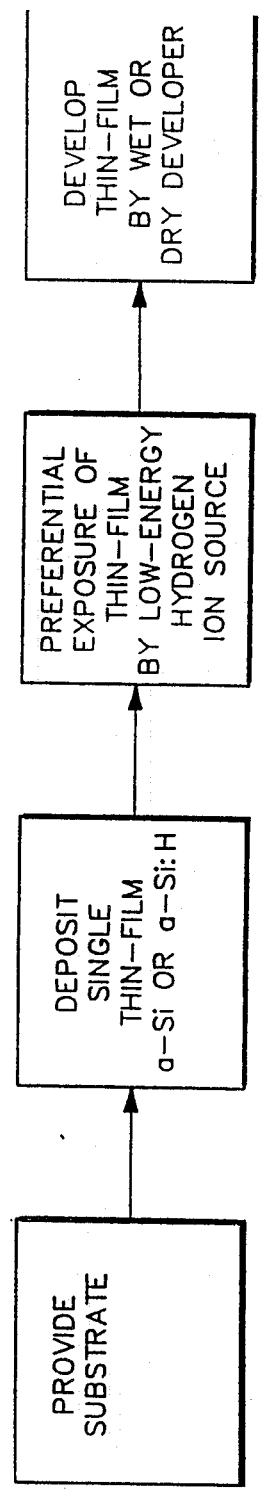

HYDROGEN ION MICROLITHOGRAPHY

CONTRACTUAL ORIGIN OF THE INVENTION

The U.S. Government has rights in this invention pursuant to Contract No. DE-AC02-83CH10093 between the U.S. Department of Energy and the Midwest Research Institute.

BACKGROUND OF THE INVENTION

1. Field of the Invention

The invention relates generally to semiconductor lithography and pertains, more specifically, to a hydrogen ion microlithography process.

2. Description of the Prior Art

Recently, there has been an extremely rapid growth in the application and fabrication of microelectronics. Microelectronics fabrication generally concerns using conventional semiconductor lithography to produce various micrometer-sized discrete semiconductor devices, integrated circuits and solid-state devices. Generally, in semiconductor lithography, a high resolution integrated circuit pattern is formed in a resist overlaying a semiconductor substrate. A permanent micrometer-size device structure is formed with the resist pattern acting as a mask by subtractive etching or removal or by additive deposition of metals or insulators.

To continue, the application of microelectronics presently pervades virtually all aspects of commercial, military, business and leisure activities. Moreover, microelectronics has caused profound changes in such diverse fields as computers, calculators, communications, entertainment, sports equipment and process-control systems. Additionally, the size and performance of micrometer-size devices have substantially improved through microminiaturization. Microminiaturization generally describes the reduction in size of solid state devices to submicron level circuits through semiconductor lithography.

For example, the sizes of electronic circuits in a pocket calculator have been reduced from those that fit in a large, desk-top machine to those that fit on the head of a pin. To take another example, a basic functional electrical element of a microelectronic circuit is a transistor. Microminiturization has made it possible to fabricate thousands of transistors in a single chip. This reduction in transistor size has also dramatically increased the operational speed of microelectronic circuits and has lowered the cost per circuit by several orders of magnitude.

Despite this rapid growth, many applications need even higher performance levels, higher functional density, higher reliability and lower production cost. Two promising ways to achieve the desired goals have emerged. The first is by submicrominiaturization, or making the microdevices even smaller. The second is by making the integrated circuit chips as large as possible to stave off forming smaller linesize, submicrometer geometries and device dimensions. Linesize generally concerns the width of features at the resist, while the chip generally refers to the thin-film semiconductor material on which the microcircuits are formed.

However, the need to produce larger chips is significantly limited by the defect density of lithography processing operations. Defect density normally is associated with an average density of fatal defects or contaminates on the chip's surface. For example, a dust particle usually leaves a pinhole with metal in a circuit line used for lift-off, and such a defect can be the cause of a short. The defects can originate from the chip itself, etching, process equipment, storage boxes, personnel, human error or defects in a mask-to-mask pattern. As the chips become larger and the lines become closer, the number and size of the defects must be reduced for good yield.

Since the defect density limits the growth and size of the chip, producing smaller microdevices with closer spaced, narrower features or lines is an increasingly popular way to increase the functional density. The size of the lines usually is a strong function of exposure. Exposure normally involves subjecting the resist to some form of electromagnetic radiation. The radiation causes a differential change in some resist property such that specific line patterns can be formed during resist development. As previously mentioned, development generally involves the removal or additive deposition of a metal or insulator. For these reasons, exposing and developing the resist are dominant areas that provide limitations to reducing the linewidths and the associated device dimensions. Thus, concentration will be hereinafter focused on the needs and problems of the prior art from a resist and processing viewpoint.

To address the needs and problems of resist processing in submicrominiaturization, the microelectronic industry is attempting to refine the dominant semiconductor lithography or photolithography processing procedures. Unfortunately, the desired smaller linewidths, submicrometer device dimensions and geometries usually are beyond the capabilities of photolithography.

For example, a photolithographic mask usually contains an open or transparent pattern. Ultraviolet light is transmitted through the pattern to expose corresponding resist regions for subsequent development. Unfortunately, diffraction effects from the mask openings and reflection effects within the resist frequently degrade the quality of the replicated mask image. The diffraction effects usually occur when the mask is separated from the resist, when high resolution is demanded and when the linewidth is reduced to being comparable to the wavelength of the ultraviolet light. Resolution generally concerns resolving the finest linewidths associated with the wavelength of the ultraviolet light source. Additionally, when the mask is placed relatively close to the resist, irregularities on the resist often cause defects at the mask surface. Such defects frequently result in corresponding defects in the next resist exposed with that mask.

To cope with the problems of diffraction, the microelectronic industry has employed projection photolithography. Projection photolithography normally employs a shorter radiation wavelength to expose the resist and a mask that forms an object in an optical system. The optical system projects an image either in real size or demagnified onto the resist. The shorter radiation wavelength beneficially reduces the diffraction effects. However, spherical aberration effects in lenses of the optical system normally undesirably limit the resolution of this replication process.

In an attempt to alleviate many of the aforesaid problems in photolithography, the microelectronic industry has turned to high-energy (shorter wavelength) radiation exposure systems. For purposes of the present application, high-energy radiation exposure systems are systems with an exposure energy greater than 1000 eV. The conventional sources of such systems are electron beams (e-beams), ion beams and X-rays, which use shorter wavelengths and higher energy photons. The high-energy radiation sources can be employed to either focus a beam of electron energy to a spot or cause the electron energy to be collimated and masked to flood expose the resist.

A number of publications discussing the use of such conventional exposure systems include: an abstract entitled, *Focused Ion Beam Scans Small Structure*, Test & Measurement World, p. 16 (1988); Darryl W. Peters, *Keeping America Competitive, Examining Competitive Submicron Lithography*, Semiconductor International, pp. 96–100 (1988); Irwin Goodwin, *Compact X-Ray Lithography Machines Generate Hope for Semiconductors*, Physics Today, pp. 49–52 (1988); Joseph Grenier, *Wafer Fabrication Equipment Five Year Forecast*, Solid State Technology, pp. 67–70 (1988); and William Thurber, *Photolithography's Heir Still Not Obvious, Says Interface Keynote*, Semiconductor International, p. 15 (1988).

In e-beam lithography, which is normally considered the dominant high-energy radiation source, the beam exposes the resist where it strikes and locally changes its characteristics. Subsequent resist development can either selectively remove the exposed resist regions or remove the unexposed regions. However, proximity effects are the primary limitation that prevents obtaining satisfactory linewidths with the e-beam lithography. Proximity effects describe pattern fidelity degradation. This degradation is primarily caused by electron scattering and secondary electron generation in the resist and the chip. For instance, the proximity effects create an exposed volume of resist that is wider than the diameter of the impingent beam.

In X-ray lithography, continuous X-rays are normally produced by electron bombardment of a fixed or rotating anode. Unfortunately, faster organic resists are usually required since the X-ray sources are frequently too weak for present single-film organic resist. For example, generally, no practical single-film organic resist can be exposed rapidly enough to be competitive with projection photolithography.

Likewise, conventional ion lithography, as opposed to the hydrogen ion microlithography of the present invention, suffers problems similar to those of X-ray lithography. These problems are also usually associated with the newer emerging projection ion lithography. For these reasons, the application of conventional high-energy radiation exposure sources such as ion beam lithography is often restricted to fabricating, measuring and repairing photo mask. The publication of T. D. Cambria and N. P. Economou, *Mask and Circuit Repair With Focused-Ion Beams*, Solid State Technology, pp. 133–136 (1987), explains the use of focused-ion beam technology for mask and circuit repair.

The exposure, development and processing problems relating to organic-based resist have motivated the microelectronic industry to look for a resistless process. A resistless process would directly form circuit components and eliminate all the resist process steps. Generally, the major conventional energy sources existing in resistless, lithography technology are high-energy X-rays, lasers, e-beams and ion beams. However, resistless lithography is comparatively in its infancy. Moreover, the beams of the major high-energy sources normally are difficult to spread over large surface areas.

Several solutions to the problems associated with organic resist exposure, development and processing are disclosed in U.S. Pat. Nos. 4,569,124; 4,601,778; 4,615,904; and 4,377,437. For example, U.S. Pat. No. 4,569,124 discloses forming thin conducting lines in a two-layered inorganic material such as silicon or aluminum overlying a layer of refractory metal with a high-energy, ion-beam implantation source. The two-layered material behaves as a resist. In U.S. Pat. No. 4,601,778, portions of a polysilicon film are initially exposed to either an oxygen plasma or a hydrogen plasma, and thereafter, the entire polysilicon film is exposed to a polysilicon etchant and etched without the need to employ a mask. In U.S. Pat. No. 4,615,904, a patterned film is deposited onto a substrate using a laser energy source or a low-power, focused e-beam source. Lastly, in U.S. Pat. No. 4,377,437, a high-powered ion source for implanting indium, gallium or gold ions is used to define features directly on an inorganic layer of a solid-state precursor device, for example $SiO_2$ or $Si_3N_4$, which serves as a mask.

In a development involving gallium ion implantation, P. H. La Marche and R. Levi-Setti, *Amorphous silicon as an inorganic resist*, SPIE Vol. 471, Electron-Beam X-Ray and Ion-Beam Technique for Submicrometer Lithographics 111, pp. 60–65 (1984), discloses that negative tone images can be produced in glow-discharge amorphous silicon hydride by selective gallium-ion implantations. Also, the gallium implanted amorphous silicon exhibits a greatly reduced etch rate. Regarding the concept of reducing the resistance to etchants through ion implantation, the publication of P. A. O'Connell, *Formation of Resistive Films by Ion Bombardment, Colloquium on Ion Implantation*, London England, p. 7 (1970) discusses the formation characteristic of resistance in aluminum films subjected to oxygen ion bombardment.

The present invention, however, represents yet another different development and solution, which employes a low-energy hydrogen ion source, and which results in unexpected improved microlithography process procedures, particularly with respect to eliminating all of the organic resist process steps. The attributes of the present invention are reflected in the following objects.

SUMMARY OF THE INVENTION

Against the foregoing background, it is a general object of the present invention to provide a low-energy, hydrogen ion microlithography process that overcomes many of the aforesaid shortcomings and disadvantages associated with prior art organic resist used in conventional lithography processes.

It is a specific object to use hydrogen ion microlithography as a means to effect patterning without the need for employing an organic resist.

It is another specific object to use hydrogen ion microlithography as a means to permit amorphous silicon or hydrogenated amorphous silicon to serve as an inorganic single-layered resist.

It is a further specific object to use hydrogen, ion microlithography as a means to permit a single layer of thin-film amorphous silicon or hydrogenated amorphous silicon to serve as a positive or negative resist.

It is still a specific object to use hydrogen ion microlithography as a means to permit a single layer of thin-film amorphous silicon or hydrogenated amorphous silicon to serve as a resist that is suitable for development by either a wet developer or a dry developer.

It is yet and still a specific object to use hydrogen ion microlithography as a means to directly pattern amorphous silicon or hydrogenated amorphous silicon as a means to substantially eliminate many of the clean room operations required when employing organic resists.

The above objects, as well as still further objects and advantages, are obtained by the present invention by providing an ion microlithography process for use in microelectronic fabrication and semiconductor device processing. The process includes: providing a single layer of either an amorphous silicon or a hydrogenated amorphous silicon material. A pattern is recorded in a selected one of the single layers of amorphous silicon or hydrogenated amorphous silicon by preferentially implanting hydrogen ions therein so as to permit the selected layer to serve as a resist suitable for subsequent development. Finally, the selected layer is developed to provide a surface pattern therein adaptable for subsequent use in microelectronic fabrication and semiconductor device processing.

BRIEF DESCRIPTION OF THE DRAWINGS

The accompanying drawings, which are incorporated in and form a part of the specification, illustrate preferred embodiments of the present invention and together with the description serve to explain the principles of the invention, wherein:

FIG. 2 is a broken, enlarged, cross-sectional view of the chip of FIG. 1 after positive development.

FIG. 3 is a broken, enlarged, cross-sectional view of the chip of FIG. 1 after negative development.

FIG. 4 is a flow chart illustrating the general process steps used in the hydrogen ion microlithography of the present invention.

DETAILED DESCRIPTION OF THE PREFERRED EMBODIMENTS

Figure 1:
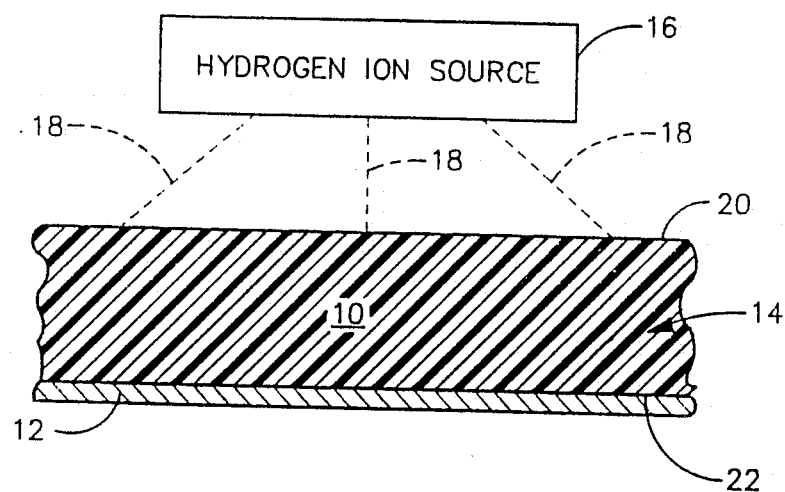
FIG. 1 is a partly broken, enlarged, cross-sectional view of a chip comprising a selected layer of either amorphous silicon or hydrogenated amorphous silicon being subjected to ion implantation from a low energy, hydrogen ion source in accordance with the invention.

Referring now to the drawings and especially to FIGS. 1–4, the present invention uses low-energy hydrogen ion microlithography as a means to preferentially expose and pattern a selected thin film of either amorphous silicon or hydrogenated amorphous silicon for subsequent microdevice fabrication and semiconductor processing without the need of an organic resist. In practicing the invention, a chip 10 having a substrate 12 and a single starting thin-film layer 14 is formed and processed.

As is best illustrated in FIGS. 1 and 4, the substrate 12 is initially provided to support the thin film 14. Depending on the application and ultimate use of the processed chip 10, the substrate 12 may preferably be a low-cost metal, a glass, or a plastic material. For instance, in integrated-circuit manufacture applications, the substrate 12 preferably comprises a single-crystal semiconductor material with or without an oxide layer. An example of such two materials are silicon and gallium arsenide. For large-area, display circuit, manufacture applications, the substrate 12 preferably comprises a semiconductive or a conductive thin film layer, which is itself deposited on a substrate.

Following the formation of the substrate 12, it is one feature of the present invention to form the base or starting thin film 14 from either an amorphous silicon material or a hydrogenated amorphous silicon material. The amorphous silicon or its hydrogenated form is used as the base material for several reasons. Some of these reasons concern the development and exposure properties of the thin film 14, as will be more fully described hereinbelow.

Any number of conventional deposition processes suitable for depositing a single thin film 14 of amorphous silicon or hydrogenated amorphous silicon to a thickness of less than about 1 micrometer ($10^{-6}$ m) may be employed. When amorphous silicon material with little or no hydrogen content therein is chosen for the base layer 14, it may be deposited, for example, by sputtering, photochemical vapor deposition, physical vapor deposition, homogeneous chemical vapor deposition (CVD) or light-induced CVD using infrared lasers. Preferably, a high-quality amorphous silicon layer is deposited onto the substrate 12 under a vacuum by plasma-assisted CVD or glow discharge CVD.

When a hydrogenated amorphous silicon layer is selected for the base layer 14, it can be formed in one manner by concurrently introducing the hydrogen and silicon atoms therein. For example, photoinduced CVD is one suitable deposition process for introducing atomic hydrogen into the amorphous silicon during its growth to produce a hydrogenated amorphous film. Preferably, radio frequency (RF) glow-discharge CVD is used for this purpose.

Alternatively, the desired hydrogenated amorphous silicon layer may be formed by introducing the hydrogen atoms therein after the deposition of the amorphous silicon layer through post-hydrogenation or rehydrogenation. Post-hydrogenation generally involves the process of introducing the hydrogen atoms into an amorphous silicon material that was originally deposited with little or no hydrogen content. Rehydrogenation generally concerns the process of reintroducing hydrogen atoms into an amorphous silicon material that was originally hydrogenated during its deposition with the hydrogen content having been subsequently driven out by heating. It will be noted that the post-hydrogenation and the rehydrogenation operations are normally performed while the thin film 14 is being preferentially exposed for subsequent development, as will be more fully described hereinafter.

RF-generated hydrogen plasma, direct-current (DC) hydrogen plasma and microwave-excited hydrogen plasma are suitable processes for providing a desired base layer 14 of hydrogenated amorphous silicon through post-hydrogenation. Preferably, and in accordance with the process of the invention, post-hydrogenation process is performed by using a low energy hydrogen ion source. Similarly, rehydrogenation is preferably performed by using a low-energy, hydrogen, ion source with an RF glow-discharge deposited, starting and hydrogenated amorphous material.

To effect post-hydrogenation and rehydrogenation, any conventional hydrogen ion source 16 suitable for providing a low implantation energy may be used. A suitable implantation energy is in a range of from about 300 eV to about 1000 eV. A suitable current density is in a range of from about 0.1 mA/cm² to about 20 mA/cm². These ranges enable the electrical, optical and photosensitivity properties of amorphous silicon films upon hydrogenation to be enhanced, as will be more fully described hereinafter. A particularly preferred hydrogen ion source 16 is the Kaufman Ion Beam System marketed by Commonwealth Scientific Corporation under the trademark Millatron IV.

It will be appreciated that the specific details of the Kaufman Ion Beam System have been omitted from the drawings for the sake of clarity, since the system is well known in the art. Even so, the system will be briefly described. The Kaufman Ion Beam System is equipped with a turbomolecular pump and a chamber which can be evacuated to a base pressure of about $2 \times 10^{-6}$ Torr. The system has provisions for back filling with hydrogen to an operating pressure of about $8 \times 10^{-4}$ Torr. The hydrogen ions are produced in the system by bombarding with high energy electrons. The hydrogen ions are then accelerated and collimated through a stainless steel grid assembly to produce ion beams with energy that can be adjusted to any desired level up to a maximum of 2000 eV.

Having described the details of the ion source 16, a brief illustration of the rehydrogenation and post-hydrogenation operations will now be given. These illustrations will provide a better understanding of the importance of using amorphous silicon or its hydrogenated form as the base layer 14. This understanding or explanation is with respect to the structural changes and development properties occurring in the base layer 14 during the rehydrogenation and post-hydrogenation operations and during exposure.

Turning first to the post-hydrogenation processes, in this particular illustration initially, a thin film 14 of undoped amorphous silicon is preferably desposited by RF glow-discharge under a vacuum onto a high-resistivity, crystalline silicon or glass substrate 12. The substrate is deposited to a thickness of about 500 nm with a substrate temperature of about 480° C. Thereafter, the deposited amorphous silicon is bombarded by hydrogen at least once. For this purpose, a preferred implantation energy is from about 500 eV to about 600 eV and a preferred current density is about 1 mA/cm$^2$. Lastly, the resulting hydrogenated film is annealed at a temperature of about 300° C. in a vacuum for about 2 hours.

Turning now to the rehydrogenation process, in this particular illustration, an intrinsic thin film base layer 14 of hydrogenated amorphous silicon is initially deposited by RF glow discharged onto a high-resistivity crystalline substrate to a thickness of about 500 nm at a substrate temperature of about 250° C. It should be specifically noted that the invention contemplates practicing rehydrogenation with starting materials that are not fabricated with the ion source 16, as will become more apparent hereinafter. Thereafter, the hydrogenated amorphous silicon layer is annealed to a temperature of about 500° C. for about 10 hours. The annealing causes dehydrogenation or outgassing of the hydrogen.

Next, the dehydrogenated film is bombarded by low-energy hydrogen ions at least once at a preferred dose of from about 300 eV to about 1000 eV. A preferred implantation time is about 60 minutes, while a preferred current density is about 1 mA/cm$^2$. Lastly, the rehydrogenated film is annealed at a temperature of around about 200° C. in a vacuum for at least 1 hour. While post-hydrogenation and rehydrogenation have been described in connection with two particular illustrations, one skilled in the art will appreciate that the post-hydrogenation and rehydrogenation operating parameters and process steps are not necessarily so limited.

As is best shown in FIGS. 1 and 4, it is another important feature of the present invention to preferentially or selectively expose the thin film 14 with a low-energy hydrogen ion source. The film 14, as previously mentioned, comprises a selected thin film layer of amorphous silicon or hydrogenated amorphous silicon. The preferential exposure functions to directly write or transfer a high-resolution, circuit image or line pattern onto the film 14 for subsequent development. The exposure operation also functions to provide a means to enhance or to improve the electrical, optical and photosensitivity characteristics of the selected thin-film 14 material, if so desired for subsequent applications.

Any conventional hydrogen ion source 16 suitable of providing a low implantation energy of from about 300 eV to about 1000 eV may be employed to preferentially expose the deposited chosen layer 14. A preferred ion source 16 for this purpose is the previously described Kaufman Ion Beam System.

The exposure of the thin film 14 follows the film deposition. The exposure can be performed in a well-known manner either by focusing a beam of ions 18 to a spot or by collimating and masking the beam 18 to flood expose the chip 10. It will be appreciated that the specific details of the ion beam mask have been omitted from the drawings for the sake of clarity, since general principles of ion beam mask are well known in the microlithography art.

The preferred implantation energy is some discrete value between about 300 eV and 1000 eV, while the preferred current density is some discrete value between 0.1 mA/cm$^2$ and 20 mA/cm$^2$. These implantation ranges are required to provide the necessary structural and chemical changes in the base layer 14, which changes allow the desired developmental properties of the layer 14 to be realized, as will be more fully explained hereinafter. Also, the beam diameter should be at least about 10% larger than a diameter of the exposed chip 10 in order to provide satisfactory process uniformity.

It has been found in practice that the exposure and development properties are different for hydrogenated amorphous silicon materials formed by post-hydrogenation or by rehydrogenation using the ion source 16. This difference is with respect to the properties of, first, amorphous silicon films having little hydrogen therein and, second, hydrogenated amorphous silicon films, both of which have been formed by other deposition methods. Moreover, these differences contribute to allowing the single layered thin-film 14 to advantageously flexibly function as a negative or positive inorganic resist and a mask. Simply stated, a negative resist retains the exposed regions after development, while a positive resist retains the regions not exposed after development.

To explain, preferentially exposing a thin film 14 of amorphous silicon or hydrogenated amorphous silicon that was not originally hydrogenated with a low-energy hydrogen ion source causes important chemical and structural changes in these films. These changes result from the absorbed or implanted hydrogen atoms and the associated effects they cause upon being diffused into the film 14. The effects of diffusion involve the amount and arrangement of implanted hydrogen in the film, as well as the type of alloys or bonds formed therein. They also involve the semiconductor properties and the development properties of the exposed film 14. Thus, as previously mentioned, it is seen that the bonding configuration and the amount and distribution of the implanted hydrogen atoms differ in hydrogenated amorphous silicon material formed with a low-energy ion source than with hydrogenated amorphous silicon formed with other methods.

For instance, when the thin film 14 is thicker than a range of penetration from the bombarding or impinging hydrogen ions 18 of the ion source 16, the front surface 20 in the specific regions where it is bombarded accumulates substantial amounts of the absorbed hydrogen. More specifically, from about 15 at. % hydrogen to about 30 at. % hydrogen accumulates in the first 100 nm of the front surface 20 of the film 14, where it is specifically irradiated. Consequently, the hydrogen accumulating at the front surface 20 is substantially more than that accumulating at the back surface 22.

It is evident that the hydrogen absorbed by the film 14 and accumulating at the front and back surfaces 20 and 22 depends on the diffusion property of the implanted atomic hydrogen. This diffusion property is generally a function of temperature and the structure and composition of the film 14. Incidentally, because of the diffusion process, the hydrogen accumulating at the front surface 20 decreases exponentially toward the back surface 22.

Additionally, monohydrides or silicon-hydrogen (Si—H) bonds form the dominant bonding configuration where the impinging hydrogen of the low-energy ion source 16 strikes the pure amorphous silicon and the hydrogenated amorphous silicon film materials. In this way, the front surface 20 becomes substantially saturated with the silicon-hydrogen bonds. Since silicon-hydrogen bonds substantially prevent or retard the oxidation process of a film surface exposed to oxygen, it follows that the silicon-hydrogen bond enriched front surface 20 functions to significantly impede a removal or etch action of particular developers as described below.

For example, some particular wet developers can etch or remove desired regions of pure amorphous silicon and hydrogenated amorphous silicon films in a two-step oxidation reaction and oxide etching process, when such films are not formed using the low energy of the hydrogen ion source 16. However, this oxidation reaction and, thus, the etching thereof are substantially impeded with these same wet developers, when identically fabricated films are exposed or hydrogenated with the low energy of the ion source 16. As mentioned previously, the retarding action or stop-etch effect occurs, in part, because the front surface 20 is saturated with the silicon-hydrogen bonds introduced by the low-energy hydrogen ion source 16.

Similarly, some particular dry developers will remove the specific regions of the film 14 preferentially exposed by the ion source 16, while not removing the non-exposed background regions. This happens because of the chemical and structural film changes resulting from exposing the film 14 with the ion source 16. With these dry developers, specific film regions are initially provided with surface oxides. The surface oxides function to assist in preventing the removal of the background film regions not exposed by the ion source 16. The formation of the surface oxides at specific film regions are achieved by, firstly, oxidizing the surface of a dehydrogenated amorphous film 14. Thereafter, the surface oxides are selectively removed, and the film 14 is preferentially irradiated with hydrogen ions, as will be more fully explained hereinafter.

Thus, specific film regions chemically and structurally changed by the absorbed hydrogen, or by the absorbed hydrogen in conjunction with an oxide enriched surface, become resistant to some particular wet and dry developers. In particular, these changed film regions become resistant to a number of developers that can normally remove the pure amorphous silicon and the hydrogenated amorphous silicon films having certain film characteristics. A few characteristics that enable such removal concern: the uniform distribution and disposal of the implanted hydrogen atoms in these films; and film surfaces that are not saturated with silicon-hydrogen bonds or with a combination of these bonds and the surface oxides.

Said somewhat differently, some developers cannot remove the specific film regions exposed by a low-energy hydrogen ion source. Or, such developers can only remove the exposed film regions at a substantially slower removal rate than the rate at which they normally remove amorphous silicon and hydrogenated amorphous silicon film regions not exposed or hydrogenated with a low-energy hydrogen ion source. It is obvious, however, that those developers that can normally remove or etch amorphous silicon or hydrogenated amorphous silicon film regions unaltered by the exposure effects of the ion source 16 still have this type of removal capability.

Having described the details of hydrogen ion exposure, reference is made to FIG. 2 where it is best shown that after exposure, some developers will allow the single-layered thin film 14 to function as a negative resist 14a. The film 14a functions as a negative resist because, as mentioned earlier, the hydrogen-irradiated regions 26 remain after development, while the non-irradiated regions 28 are removed. In a like manner, as is best shown in FIG. 3, after exposure, other particular developers will allow removal of the hydrogen-irradiated regions 26 of such films, while allowing the non-irradiated regions 28 to remain. Thus, the single thin film 14 is caused to function as a positive resist 14b.

It follows that the preferential exposure with the low-energy hydrogen ion source 16 constitutes a method of forming high-resolution features, lines or surface structures. Moreover, these features, lines and structures are useful for applications as a microcircuit image or pattern employed in microdevice fabrication and semiconductor processing.

It will now be understood that performing rehydrogenation and post-hydrogenation operations with a low-energy hydrogen ion source 16 normally enables the resulting hydrogenated amorphous silicon film to undergo structural changes similar to those occurring in the exposed thin film 14. This holds true in rehydrogenation provided the starting hydrogenated amorphous silicon film was not fabricated with a low-energy hydrogen ion source. Moreover, it will be further understood that performing low-energy, post-hydrogenation and rehydrogenation operations on the chip 10 with the ion source 16 will normally be performed while concurrently exposing the thin film 14.

Attention is now drawn to the fact that heretofore persons skilled in the microelectronics art were not aware that a low-energy, hydrogen ion source 16 could be used in the new manner contemplated by the invention. The new process utilizes the hydrogen ion source 16 to preferentially expose single thin films of amorphous silicon or its hydrogenated form. Such exposure provides a new and useful inorganic, single-layered negative or positive resist suitable for dry and wet development, as will become even more apparent hereinafter.

It will be appreciated that the present invention also contemplates using the exposure operations of the hydrogen ion source 16 to advantageously enhance or to improve the electrical, optical and photosensitivity properties of the thin film 14 during exposure, rehydrogenation and post-hydrogenation. The photosensitivity of a hydrogenated amorphous silicon film is usually expressed by the AM1 photo-to-dark conductivity ratio. The photoconductivity relates to the photogeneration, transport and recombination of electrons and holes. Lastly, the optical properties generally involve the optical band gap and transmission. To continue, the desired properties can frequently be enhanced or improved by ion-beam hydrogenation with respect to similar properties obtained with most conventional hydrogenation processes, such as RF glow discharge hydrogenation.

As previously mentioned, the photosensitivity and other semiconductor properties of the thin films of amorphous silicon and hydrogenated amorphous silicon are usually strongly effected by small changes in their structure and chemical composition. In general, a number of detrimental changes are frequently caused by the manner in which the impinging ions during exposure, post-hydrogenation and rehydrogenation act on the semiconductor thin film 14. Generally, the ions act through sputtering and radiation damage. In practicing the invention, a number of process operations importantly contribute to minimize sputtering and radiation damage, as well as to minimize other detrimental effects that degrade the electrical and semiconductor properties.

For example, hydrogen as above mentioned, is the lightest element in the Periodic Table. Consequently, hydrogen substantially minimizes radiation and sputter damages when it is implanted into the film 14 with a low-energy hydrogen ion source such as at 16. Moreover, it is found in practice that the acceleration associated with the generated hydrogen ions from the ion source 16, substantially facilitates the penetration of the ions into the film 14. Hence, the diffusion of the hydrogen ions from the front surface 20 to the back surface region 22 of the film 14 is readily accomplished. Consequently, hydrogenation performed with the low-energy ion source 16 is normally substantially more efficient. This efficiency is with respect to hydrogenation performed with other methods that provide less acceleration of the hydrogen ions, such as the prior art RF-hydrogenation method.

Also, the implanted hydrogen acts to passivate the exposed thin film 14, and thus, acts to enhance its photoconductivity. The implanted hydrogen functions to enhance the photoconductivity because generally the hydrogen content of the film 14 is increased. Moreover, the increased level of hydrogen functions to remove localized states and to modify an energy gap of the film material by removing the localized states therefrom.

Additionally, using the amorphous silicon or its hydrogenated form as an inorganic resist advantageously eliminates all the problems associated with defects derived from organic resist processing. Moreover, low defect processing is advantageously enhanced by performing the fabrication and exposure operations of the chip 10 in a vacuum. Also, such an inorganic resist advantageously eliminates all the remaining non-contamination control process steps associated with conventional organic resist exposure, development and processing. Lastly, it is evident that eliminating the organic resist process operations advantageously reduces the cost of fabricating devices contemplated by the present invention.

Incidentally, the publication of Y.S. Tsuo, E.B. Smith, and S.K. Deb, *Ion Beam Hydrogenation of Amorphous Silicon*, Appl. Phys. Lett. 51 (18), pp. 1436–1438 (1987) provides a more complete explanation of the nature and extent to which some properties can be improved through rehydrogenation using a low-energy hydrogen ion source. In this instance, photo-to-dark-conductivity ratios as high as $5.6 \times 10^5$ at air mass one with hydrogen-implanted materials were obtained with the Kaufman Ion Beam System. Also, by way of background, this publication points out that light-induced reduction of the photo- and dark conductivities in the rehydrogenated materials after 20 h of AM1 illumination were eliminated. Lastly, improvements in the optical band gap and an ability to controllably incorporate more hydrogen into the rehydrogenated material then was originally deposited by glow discharge was achieved.

It is now apparent that when the selected base thin film 14 is amorphous silicon, it can be advantageously provided with substantially high photosensitivity properties and stability properties during the exposure or hydrogenation process operations. Moreover, the optical properties can be precisely controlled, while the electrical and photosensitivity properties of the specific thin film regions hydrogenated or exposed by the ion source 16 can be enhanced or improved. Incidentally, it should be noted that the control of the optical properties advantageously enables the present invention to be used in the fabrication of amorphous silicon memory devices.

Following the exposure of the chip 12 to hydrogen, it is yet another important feature of the present invention to employ the selected single thin-film layer 14 as an inorganic mask-resist. This mask-resist, significantly, is suitable for development by wet or dry developers. As previously mentioned, during the preferential exposure of the thin film 14, the exposed regions 20 are structurally changed to record a pattern therein for subsequent development. By recording the pattern lines, it is apparent that the inorganic, mask-resist functioning thin-film 14 is useful for subsequent microdevice fabrication that requires a pattern definition.

As is best shown in FIGS. 2, 3 and 4, it is still another feature of the present invention to employ both dry and wet developers following exposure. Wet development generally involves a liquid or solvent etching through oxidation-reduction reactions from metals and displacement. Dry development generally involves solventless development by sublimation or vaporization of the resist material through direct irradiation or by using a reactive plasma gas to differentiate the image. The plasma gas may be described as a conductive gas with equal densities of positively and negatively charged particles and excited neutral radicals.

A suitable wet developer for etching the exposed selected single layered thin film 14, when it is functioning as a positive resist 26, is a solution of isopropyl alcohol (IPA), potassium hydroxide (KOH) and water ($H_2O$) with about 25 wt % or more IPA, about 20 wt % KOH and about 55 wt % $H_2O$.

Additionally, a suitable wet developer for etching the exposed film 14, when it is functioned as a negative resist 24, is a solution of KOH, IPA, and $H_2O$ with about 24 wt % KOH, about 13 wt % IPA and about 63 wt % $H_2O$.

A suitable dry or solventless developer employed to develop the exposed single-layered thin film 14, when it is acting as a positive resist 30, is an RF-generated hydrogen plasma. The dry development of the film 14 when it is functioning as a positive resist is preferably performed with the RF-generated hydrogen plasma. However, it should be understood that other suitable dry developers having adequate characteristics to effect sublimation of the exposed film 14 or to chemically differentiate the pattern thereon when the film 14 is functioning as a positive or negative resist may be employed, as will occur to those skilled in the art.

Similarly, wet developers other than the IPA+KOH+$H_2O$ etchants described hereinabove, having the adequate characteristics to remove the exposed regions or unexposed regions of the thin film 14 at a rate faster than its background and in a controlled manner may be employed, as will occur to those skilled in the art.

The following examples serve to illustrate certain preferred embodiments of the present invention and are not to be construed as to limiting the scope of the present invention.

EXAMPLE 1

First, a base intrinsic hydrogenated amorphous silicon thin film 14 was deposited by RF-glow discharge on a 2.54 cm by 2.54 cm glass substrate at a 250° C substrate temperature in a load-locked, single-chamber system to a thickness of about 400 nm. The optical band gap of the starting hydrogenated amorphous silicon film was about 1.75 eV, while the photo-to-dark conductivity ratio was about $1 \times 10^6$. The base film was then heated at about 540° C in a $10^{-6}$ Torr vacuum for approximately 10 hours to outdifuse the hydrogen.

Next, the hydrogen ion source 16 with an energy of approximately 600 eV and a current density of approximately 0.24 mA/$cm^2$ was masked to preferentially expose and pattern the base film for about 4 hours at a temperature of about 250° C. Lastly, a wet developer comprising a solution of IPA (13 wt %), KOH (24 wt %) and $H_2O$ (63 wt %) was employed to develop the specific pattern of the hydrogenated amorphous silicon film.

It was found that the exposed portions of the preferentially hydrogenated amorphous silicon film did not etch. However, the unexposed portions thereof were uniformly etched or removed (negative) at an etch rate of about 10 nm/min. Additionally, patterns about $1 \times 10^{-6}$ m wide with very little undercutting of the film were produced. Scanning electron microscopy was employed to detect localized defects, such as nicks, cracks, pits and pinholes. However, the background film regions were substantially free of such defects. The optical band gap and the photo-to-dark conductivity ratio of the exposed hydrogenated regions remaining after development were about 1.8 eV and $1 \times 10^7$, respectively.

EXAMPLE 2

It is to be noted that the chip of Example 2, which comprises a glass substrate and a base film, as well as the chip and its associated glass substrate and base film of Example 3, were fabricated in substantially the exact same manner as the chip described in Example 1. The primary differences between fabricating the chips of Example 1 and Example 2 are that the exposed Example 2 chip was developed using a different composition or a wet developer. Also, the base film of the Example 1 chip functioned as a negative resist, instead of a positive resist.

To accomplish fabricating the specific pattern of the Example 2 chip, a wet developer comprising a solution of IPA (25 wt %), KOH (20 wt %) and $H_2O$ (55 wt %) was employed subsequent to preferentially exposing the single layered thin film, as described in Example 1.

Figure 5:
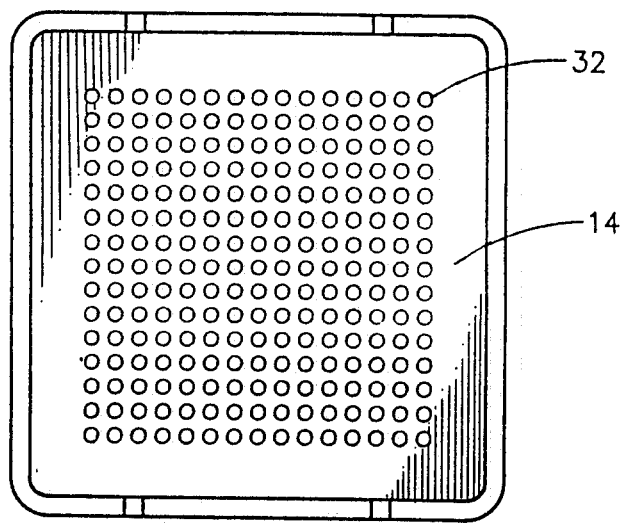
FIG. 5 is an example of a pattern of dots in a positive functioning single thin-film layer of hydrogenated amorphous silicon fabricated using the low-energy hydrogen ion source of FIG. 1.
Figure 6:
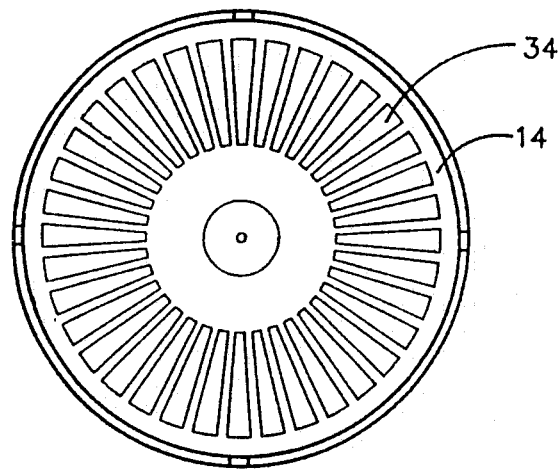
FIG. 6 is an example of a collection of a variety of line patterns in a positive functioning single thin-film layer of hydrogenated amorphous silicon fabricated using the low-energy hydrogen ion source of FIG. 1.

It was found that the unexposed portions of the preferentially hydrogenated amorphous silicon film did not etch, while the exposed portions thereof were uniformly etched or removed (positive) at an etch rate of about 10 nm/min. Turning once again to the drawings, it will be appreciated that a pattern of dots 32 depicted in FIG. 5 and a collection of variously configured line patterns 34 depicted in FIG. 6 exemplify using the hydrogen ion source 16 with the thin film 14 functioning as a positive resist. The smallest feature sizes exemplified in FIGS. 5 and 6 are about 0.2 mm wide.

EXAMPLE 3

It will be noted that the Example 3 chip was fabricated in a manner identically described for the Example 1 chip, except for the manner in which the Example 3 chip was developed. To accomplish the dry development of the Example 3 chip, a hydrogen plasma was employed. More specifically, the RF glow-discharge fabricated hydrogenated amorphous silicon base film of the chip was initially dehydrogenated by substantially the identical treatment described in Example 1. Thereafter, the dehydrogenated film was oxidized.

For this purpose, the dehydrogenated base film 14 was exposed to air at ambient temperature for several days. Next, the surface oxides were selectively removed by ion-beam bombardment. Incidentally, any number of other conventional techniques can be employed to remove the surface oxide. For example, sputtering, mechanical scratching and chemical etching are a few of the techniques that can be used to remove the surface oxides. Notably, while the dry development of the exposed film has been described in connection with surface oxidation and preferential removal of the oxidized film surface, one skilled in the art will appreciate that the invention is not necessarily so limited. Thereafter, the chip 10 was put in a vacuum system for RF-generated-hydrogen plasma dry development. The plasma development was performed using a 5 Torr gas pressure and a 0.15 W/$cm^2$ RF-power density.

It was found that the unexposed oxidized portions of the preferentially hydrogenated amorphous silicon film were virtually not removed. However, the exposed regions substantially free of surface oxides were removed (positive) at a rate of about 0.5 nm/s. The hydrogen plasma developed pattern provided excellent contrast. Moreover, the remaining surface regions protected by the surface oxides were substantially free of defects such as pinholes.

It should be noted that the theoretical minimal feature size or linewidth obtainable using the ion source 16 and the process of the present invention is about 100 times smaller than the 0.2 micrometer linewidth limitation normally obtained using photolithography. This minimal feature size is generally based, in part, on the magnitude of the exposure energy employed by the hydrogen ion source 16, with respect to the energy magnitudes utilized by other conventional exposure sources; and the development characteristics of the hydrogen-exposed amorphous silicon and hydrogenated amorphous silicon thin films, as well as the uniformity and thinness at which these thin films can be deposited (less than 0.1 micrometer).

It should be further noted that the present invention, as previously mentioned, represents a different development and solution for eliminating organic based resist and associated etching processes. To the accomplishment of this difference, the invention centers on uniquely using the lightest element in the Periodic Table, hydrogen, for implantation. Unlike gallium, boron and phosphorus, hydrogen is normally not employed as a dopant in silicon. Moreover, the hydrogen ion implantation normally benefically substantially minimizes radiation, sputtering and contamination damage with respect to implantation with heavier elements such as aluminum or gallium. In fact, as earlier described, hydrogen implantation normally satisfactorily acts to passivate defects in amorphous silicon films. Moreover, a low-energy hydrogen ion source, as opposed to a high-energy ion source, is employed to preferentially expose and to record a high-resolution pattern in a single thin-film layer of either amorphous silicon or hydrogenated amorphous silicon. Lastly, the patterned single layer serves as a negative or positive resist suitable for subsequent development with wet or dry developers.

The foregoing examples are for illustrative purposes only and the invention is not to be limited except as set forth in the following claims.

Wherefore we claim:

1. An ion-beam lithography process useful in microelectronic fabrication and semiconductor device processing, said process comprises the steps of:
   (a) providing a layer of either an amorphous silicon or hydrogenated amorphous silicon materials;
   (b) recording a pattern in said layer by preferentially implanting hydrogen therein to permit said layer to serve as a resist suitable for subsequent development; and
   (c) developing said layer to provide a surface pattern therein for subsequent use in said microelectronic fabrication and said semiconductor device processing.

2. The process of claim 1, wherein said layer comprises a single thin-film layer.

3. The process of claim 1, wherein the step of recording a pattern further comprises modifying said layer through preferential hydrogenation, such that, said developing step selectively removes the hydrogenated regions of said layer, while retaining the regions of said layer which are substantially free of said hydrogenation.

4. The process of claim 1, wherein the step of recording a pattern further comprises modifying said layer through preferential hydrogenation, such that said developing step selectively removes the regions substantially free of said hydrogenation while retaining the hydrogenated regions of said selected layer.

5. The process of claim 1, wherein the step of developing said resist further comprises providing a surface pattern for subsequent microcircuit fabrication without employing an organic resist cover.

6. The process of claim 1, wherein the step of recording a pattern further comprises preferentially hydrogenating said layer in a manner to enable said layer to function as a negative resist for subsequent development.

7. The process of claim 1, wherein the step of recording further comprises preferentially hydrogenating said layer in a manner to enable said layer to function as a positive resist for subsequent development.

8. The process of claim 1, wherein the step of providing a layer of either amorphous silicon or hydrogenated amorphous silicon further comprises depositing said layer at a thickness of in a range of from about 0.05 micron to about 1 micron.

9. The process of claim 1 wherein the step of developing said layer, further comprises utilizing a dry developer.

10. The process of claim 1, wherein the step of developing said layer further comprises utilizing a wet developer.

11. The process of claim 1, wherein the step of providing said layer of either amorphous silicon or hydrogenated amorphous silicon further comprises depositing said layer in a vacuum and, thereafter, performing both steps of recording a pattern in said layer and developing said layer in a vacuum to substantially minimize the occurrence of defects.

12. The process of claim 1, wherein the step of recording a pattern in said layer comprises forming line patterns with a width of less than 1 micrometer.

13. The process of claim 1, wherein the step of recording a pattern further comprises using a focused, scanning hydrogen ion beam.

14. The process of claim 1, wherein the step of recording a pattern further comprises using a collimated and masked hydrogen ion beam.

15. The process of claim 1, wherein the step of recording a pattern further comprises using a low-energy hydrogen ion source having an energy of less than 1000 eV and a current density of less than 20 mA/cm$^2$.

16. The process of claim 1, wherein the step of recording a pattern further comprises using a low-energy hydrogen ion beam source with a beam width at least 10% larger than a diameter of said layer being implanted with hydrogen.

17. In a high-resolution lithography process for making micrometer-sized electronic devices, said process comprising the steps of:
   (a) providing a substrate for receiving thereon a semiconductor thin-film for production of microdevices;
   (b) choosing an amorphous material selected from the group consisting of silicon and hydrogenated amorphous silicon for said semiconductor thin film;
   (c) depositing in a vacuum a single thin-film of the chosen material onto said substrate;
   (d) preferentially exposing said deposited thin-film with atomic hydrogen without an inorganic resist cover using a substantially low-energy hydrogen-ion source for directly transferring an image to said chosen, deposited, single thin-film in a manner to provide a high-resolution pattern and image within said deposited thin-film for subsequent development, and to provide said deposited thin-film with optical, photosensitivity and electrical characteristics for active microdevice fabrication;
(e) modifying said deposited thin-film during said exposure, such that the exposed regions defined by said image are capable of withstanding removal upon development, and the remaining regions substantially free of said exposure are enabled to be removed upon development, and wherein said deposited thin film serves as an inorganic negative resist; and
(f) developing said imaged thin-film with a desired wet developer to effect a chip for subsequent microdevice fabrication by preferentially removing said regions free of said exposure at a substantially faster removal rate than for removing said exposed regions.

18. In a high-resolution lithography process for making micrometer-sized electronic devices, said process comprising the steps of:
(a) providing a substrate for receiving thereon a semiconductor thin-film for production of microdevices;
(b) choosing an amorphous material selected from the group consisting of silicon and hydrogenated amorphous silicon for said semiconductor thin film;
(c) depositing in a vacuum a single thin-film of the chosen material onto said substrate;
(d) preferentially exposing said deposited thin-film with atomic hydrogen without an inorganic resist cover using a substantially low-energy hydrogen-ion source for directly transferring an image to said chosen, deposited, single thin-film in a manner to provide a high-resolution pattern and image within said deposited thin-film for subsequent development, and to provide said deposited thin-film with optical, photosensitivity and electrical characteristics for active microdevice fabrication;
(e) modifying said deposited, thin-film during said exposure, such that the regions substantially free of said exposure defined by said image are capable of withstanding removal upon development, and the remaining exposed region are enabled to be removed upon development, and wherein said deposited thin film serves as an inorganic positive resist; and
(f) developing said imaged thin-film with a desired one of a dry developer or a wet developer to effect a chip for subsequent microdevice fabrication by preferentially removing a desired one of said exposed regions at a substantially faster removal rate then for removing said regions substantially free of said exposure.

19. The process of claim 18, further comprising oxidizing said chosen film prior to said preferential exposure thereof and, thereafter, preferentially removing surface oxides from said oxidized chosen film, and wherein a plasma gas is employed as said dry developer to effect the dry development of said image subsequent to said exposure.

20. The process of claim 19, wherein said plasma developer comprises an RF-hydrogen generated plasma.

21. In a semiconductor lithography process for replacing an organic-based resist with an inorganic semiconductor material having electrical, photosensitivity, and optical properties for fabricating active circuit components, said process comprising the steps of:
(a) forming a chip for circuit component fabrication from a desired one of a single thin-film amorphous silicon or a hydrogenated amorphous silicon material;
(b) selectively bombarding the desired thin film with hydrogen to directly write high-resolution lines for defining circuit patterns in a surface of said desired thin film, and to provide said desired thin film with performance characteristics for active circuit component fabrication;
(c) locally changing a structure of said desired thin film during the selective hydrogen bombardment to allow the bombarded regions of said desired thin film to serve as a negative resist with a first wet developer and to serve as a positive resist with a second wet or dry developer;
(e) using a developer to develop said desired thin film to effect said circuit patterns for subsequent fabrication of said active circuit components.

22. The process of claim 21, wherein said developer is a wet developer for use when said desired thin film serves as a negative resist.

23. The process of claim 21, wherein said developer is a wet developer for use when said desired thin film serves as a positive resist.

24. The process of claim 21, wherein said developer is a dry developer for use when said desired thin film serves as a positive resist.

* * * * *